United States Patent
Hwang (10) Patent No.: US 8,890,613 B2
(45) Date of Patent: Nov. 18, 2014

(54) SIGNAL AMPLIFICATION CIRCUIT

(71) Applicant: SK Hynix Inc., Gyeonggi-do (KR)

(72) Inventor: Tae-Jin Hwang, Gyeonggi-do (JP)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/718,421

(22) Filed: Dec. 18, 2012

(65) Prior Publication Data

US 2013/0162353 A1    Jun. 27, 2013

(30) Foreign Application Priority Data

Dec. 22, 2011  (KR) .................. 10-2011-0140370

(51) Int. Cl.
*H03F 3/45*    (2006.01)
(52) U.S. Cl.
CPC .. *H03F 3/45076* (2013.01); *H03F 2203/45166* (2013.01); *H03F 3/45183* (2013.01); *H03F 2203/45466* (2013.01); *H03F 2203/45248* (2013.01); *H03F 2203/45674* (2013.01); *H03F 2203/45641* (2013.01)
USPC .......................................... 330/260; 330/259

(58) Field of Classification Search
CPC ............ H03F 3/45183; H03F 3/45659; H03F 3/45479; H03F 2203/45424; H03F 3/45475; H03F 1/3211; H03F 3/45071; H03F 1/34; H03F 1/083; H03F 3/45085; H03F 2203/45702
USPC .................................................. 330/252–261
See application file for complete search history.

(56) References Cited

U.S. PATENT DOCUMENTS 6,822,505 B1 *  11/2004  Palaskas et al. ............... 327/551
7,746,168 B2 *   6/2010  Oishi ............................ 330/252

\* cited by examiner

*Primary Examiner* — Hieu Nguyen
(74) *Attorney, Agent, or Firm* — IP & T Group LLP (57) ABSTRACT

A signal amplification circuit includes a differential amplifier configured to receive a first signal and a second signal and generate an output signal, a differential amplifier configured to receive first and second signals and generate an output signal; and a controller configured to control an amount of current flowing in the differential amplifier using the output signal.

9 Claims, 4 Drawing Sheets

SIGNAL AMPLIFICATION CIRCUIT

CROSS-REFERENCE TO RELATED APPLICATIONS

The present application claims priority of Korean Patent Application No. 10-2011-0140370 filed on Dec. 22, 2011, which is incorporated herein by reference in its entirety.

BACKGROUND

1. Field

Exemplary embodiments of the present invention relate to a signal amplification circuit.

2. Description of the Related Art

In order to store data in the semiconductor memory device, an input buffer circuit for receiving data from another device is used. The input buffer circuit receives data from an external electronic element or electronic device, amplifies the received data, and converts the amplified data into a level which may be processed by the semiconductor memory device for example, a CMOS level.

Examples of circuits used as the input buffer circuit of the semiconductor memory device may include a differential amplifier circuit using a current mirror. Here, the differential amplifier circuit refers to an amplifier which may obtain an output proportional to a level difference between two input signals. Since the differential amplifier circuit may quickly operate by sensing a minute voltage difference, that is, a differential input signal. Therefore, during a high-frequency operation, the differential amplifier circuit may provide an output signal responding at high speed. Such a differential input signal is a voltage difference between inverted signals or a voltage difference between a reference voltage and an input signal.

Meanwhile, one of main features of the recent semiconductor memory devices is a high-speed operation. When data are transmitted from other electronic elements or electronic devices through a channel, a transmission characteristic based on a frequency of the channel has the property of a low pass filter (LPF), even though there is a slight difference depending on the length of the channel. Therefore, during the high-frequency operation, data are inevitably attenuated to some extent. Accordingly, since the voltage difference between the reference voltage and the input signal decreases due to the above-described attenuation during the high-frequency operation, the quality of the output signal of the input buffer circuit may deteriorate. For example, a slew rate of the signal may decrease at an edge where the logic value of the signal transits.

In order to resolve above concerns, some of the recent semiconductor memory devices include an equalization circuit. The equalization circuit refers to a circuit having a function of preventing the quality reduction of the output signal of the input buffer circuit, caused by the signal attenuation, and may be implemented in various manners. However since the equalization circuit includes a plurality of logic gates and the like, the current consumption of the semiconductor memory device additionally increases, and the size of the semiconductor memory device significantly increases.

SUMMARY

Exemplary embodiments of the present invention are directed to a signal amplification circuit capable of controlling the amount of current flowing therein using the output signal thereof, thereby improving the quality of the output signal through a simple configuration.

In accordance with an embodiment of the present invention, a signal amplification circuit includes a differential amplifier configured to receive a first ($1^{st}$) signal and a second ($2^{nd}$) signal and generate an output signal, and a controller configured to control an amount of current flowing in the differential amplifier using the output signal.

In accordance with another embodiment of the present invention, a signal amplification circuit includes a current sourcing unit configured to source a current to a first and second node, and a current sinking unit configured to sink a current from the first node in response to a first signal and sink a current from the second node in response to a second signal, wherein the current sourcing units source a current in response to a control signal generated from an output signal of the first node and a voltage of the second node.

In accordance with yet another embodiment of the present invention, a signal amplification circuit includes a current sourcing unit configured to source a current to a first and second node, a first current sinking unit configured to sink a current from the first node in response to a first signal, a second current sinking unit configured to sink a current from the second node in response to a second signal, and a common current sinking unit connected to a common node connected to the first and second current sinking units and configured to sink a current from the common node, wherein the first and second current sourcing units source a current in response to a voltage of the second node, and an amount of current sunk by the common current sinking unit is controlled using an output signal generated from the first node.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

In the following descriptions, sourcing a current to a certain node refers to an operation of supplying a current to the node, and sinking a current from a certain node refers to an operation of receiving a current from the node. A logic level to which each signal is activated or deactivated, and the number of transistor for a circuit or a unit of the present invention may vary depending on the design and the type of the signal. Further, the selection of a PMOS or a NMOS transistor for the embodiment of the present invention should not be construed as limitation of the scope of the present invention.

Figure 1:
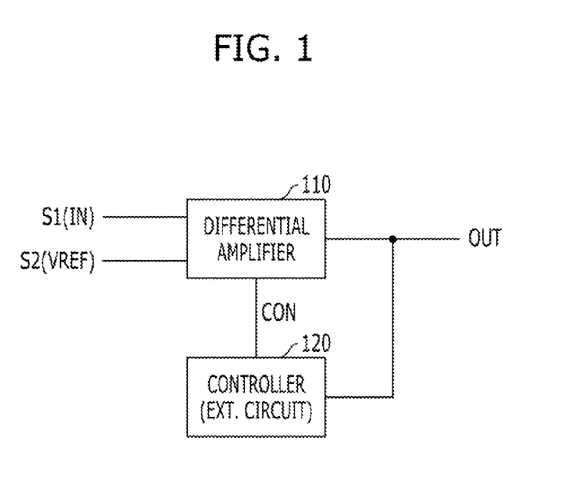
FIG. 1 is a block diagram illustrating a signal amplification signal in accordance with an embodiment of the present invention.

FIG. 1 is a configuration diagram of a signal amplification signal in accordance with an embodiment of the present invention.

Referring to FIG. 1, the signal amplification circuit includes a differential amplifier 110 and a controller 120. The differential amplifier 110 is configured to receive 1st and 2nd signals S1 and S2 and generate an output signal OUT, and the controller 120 is configured to control an amount of current flowing in the differential amplifier 110 using the output signal OUT. The differential amplifier outputs a signal having a level proportional to a difference between two input signals, and may be designed in various manners. A specific form of the differential amplifier is not limited to the embodiment of the present invention. In essence, the differential amplifier for the present invention, without limitation, controls a gain based on the amount of current flowing therein. The gain is a ratio of output signal to input signal of the amplifier.

The differential amplifier 110 generates the output signal OUT by amplifying a difference between the 1st and 2nd signals S1 and S2 using a gain controlled based on the amount of current flowing therein. The signal amplification circuit in accordance with the embodiment of the present invention may serve as an input buffer circuit of a semiconductor memory device. Here, one of the 1st and 2nd signals S1 and S2 may be an input signal IN, and the other may be a reference voltage VREF. In the following descriptions, a case in which the 1st signal S1 is the input signal IN and the 2nd signal S2 is the reference voltage VREF will be taken as an example. Therefore, the differential amplifier 110 of the signal amplification circuit of FIG. 1 generates the output signal OUT by amplifying a difference between the reference voltage VREF and the input signal IN. Here, the differential amplifier may include a differential amplifier having a current mirror (or an active load). For reference, the two input signals S1 and S2 may have logic values inverse to each other.

The controller 120 controls the amount of current flowing in the differential amplifier 110 using the output signal OUT. Since the gain of the differential amplifier 110 is controlled based on the amount of current flowing therein, the controller 120 increases or decreases the gain of the differential amplifier 110 using the output signal OUT. The controller 120 may generate a control signal CON by delaying or delaying and inverting the output signal OUT. The control signal CON is used for controlling the amount of current flowing in the different amplifier 110.

The controller 120 may generate the control signal CON by adjusting the phase of the output signal OUT (delaying or delaying and inverting the output signal OUT) as described above, or by adjusting the phase and the level (voltage) of the output signal OUT. The phase of the control signal CON decides when to change the amount of current flowing in the differential amplifier 110 (when to change the gain is decided). The level of the control signal CON may decide the amount of current change in the differential amplifier 110 (the amount of the gain is decided). As described below, the controller 120 may be an external circuit such as various drivers (including an inverter) and logic gates. The detailed operation of the differential amplifier 110 based on the control of the controller 120 will be described below.

The signal amplification circuit in accordance with the embodiment of the present invention adjusts the gain of the differential amplifier 110 using the output signal OUT of the differential amplifier 110. Therefore, the quality of the output signal OUT of the signal amplification circuit may be improved through a relatively simple configuration.

Figure 2:
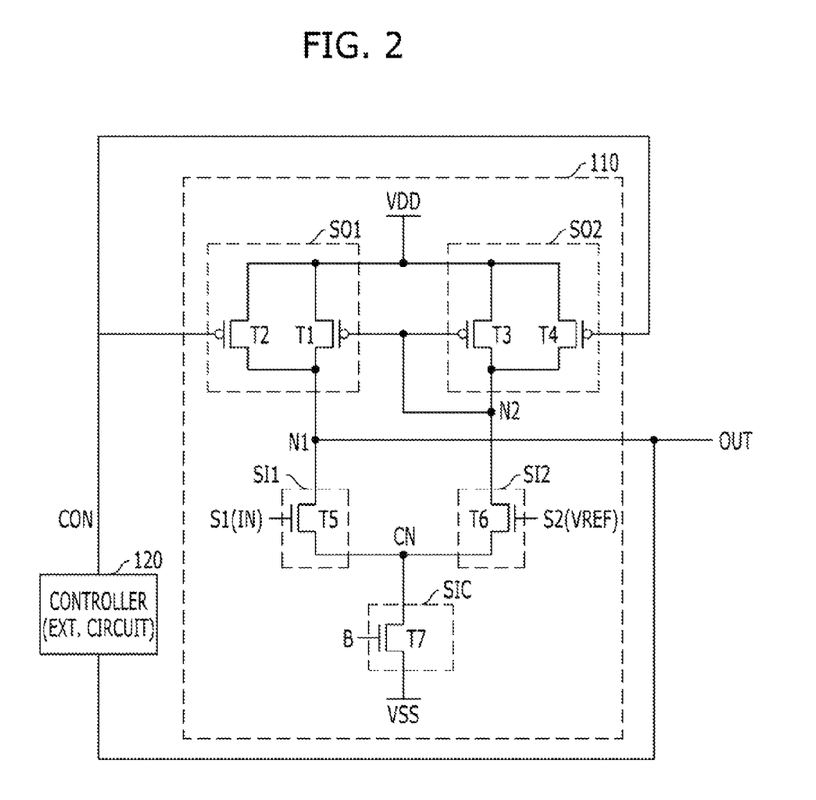
FIG. 2 is a detailed diagram of the differential amplifier shown in FIG. 1.

FIG. 2 is a detailed diagram illustrating the differential amplifier 110 of FIG. 1.

Referring to FIG. 2, the differential amplifier 110 includes a 1st current sourcing unit SO1 to source a current to a 1st node N1, a 2nd current sourcing unit SO2 to source a current to the 2nd node N2, a 1st current sinking unit SI1 to sink a current from the 1st node N1 in response to the 1st signal S1, a 2nd current sinking unit SI2 to sink a current from the 2nd node N2 in response to the 2nd signal S2, and a common current sinking unit SIC to sink a current from a common node CN connected to the 1st and 2nd current sinking units SI1 and SI2.

The 1st current sourcing unit SO1 is configured to source a current to the 1st node N1 in response to the control signal CON and the voltage of the 2nd node N2. For this operation, the 1st current sourcing unit SO1 includes a 1st sourcing transistor T1 and a 1st additional transistor T2. The 1st sourcing transistor T1 is connected to the 1st node N1 and configured to pass a current through both ends thereof in response to the voltage of the 2nd node N2, and the 1st additional transistor T2 is connected to the 1st node N1 and configured to pass a current through both ends thereof in response to the control signal CON.

The 2nd current sourcing unit SO2 is configured to source a current to the 2nd node N2 in response to the control signal CON and the voltage of the 2nd node N2. For this operation, the 2nd current sourcing unit SO2 may include a 2nd sourcing transistor T3 and a 2nd additional transistor T4. The 2nd sourcing transistor T3 is connected to the 2nd node N2 and configured to pass a current through both ends thereof in response to the voltage of the 2nd node N2, and the 2nd additional sourcing transistor T4 is connected to the 2nd node N2 and configured to pass a current through both ends thereof in response to the control signal CON.

The 1st current sinking unit SI1 may include a 1st sinking transistor T5 connected between the 1st node N1 and the common node CN and configured to pass a current through both ends thereof in response to the 1st signal IN. The 2nd current sinking unit SI2 may include a 2nd sinking transistor T6 connected between the 2nd node N2 and the common node CN and configured to pass a current through both ends thereof in response to the reference voltage REF.

The common current sinking unit SIC is configured to sink a current amount decided based on a bias voltage B from the common node CN. When the bias voltage B is not supplied (the common current sinking unit SIC does not sink a current), the differential amplifier 110 does not perform an amplification operation (disabled). When the bias voltage B is supplied (the common current sinking unit SIC sinks a current), the differential amplifier 110 performs an amplification operation (enabled). For this operation, the common current sinking unit SIC may include a common sourcing transistor T7 configured to pass a current through both ends thereof in response to the bias voltage B. In the following descriptions, a case in which the constant bias voltage B is supplied and the common current sinking unit SIC sinks a constant amount of current will be taken as an example.

The controller 120 performs the same operation as described above with reference to FIG. 1. Therefore, the signal amplification circuit of FIG. 2 will be described based on the operation of the differential amplifier 110.

When a small signal operation of the differential amplifier 110 is analyzed according to a small signal model, the entire gain of the differential amplifier 110 is inversely proportional to the amount of current flowing in the 1st sourcing transistor T1. That is, when the amount of current flowing in the 1st sourcing transistor T1 increases, the gain of the differential amplifier 110 decreases, and when the amount of current flowing in the 1st sourcing transistor T1 decreases, the gain of the differential amplifier 110 increases.

Since the bias voltage B is constant, the amount of current sunk by the common current sinking unit SIC is constant. Furthermore, since the differential amplifier has a current mirror structure, each of the amount of current sunk by the 1st current sinking unit SI1 and the amount of current sunk by the 2nd current sinking unit SI2 corresponds to a half of the amount of current sunk by the common current sinking unit SIC. Here, when an amount of current flowing from the 1st node N1 to the outside of the signal amplification circuit is ignored, the sum of the amount of current that the 1st sourcing transistor T1 sources to the 1st node N1 and the amount of current that the 1st additional transistor T2 sources to the 1st N1 must be equal to the amount of current which the 1st current sinking unit SI1 sinks from the 1st node N1 (Kirchhoff's laws). That is, the sum of the amount of current sourced by the 1st sourcing transistor T1 and the amount of current sourced by the 1st additional transistor T2 is constant.

Therefore, when the amount of current sourced by the 1st additional transistor T2 increases, the amount of current sourced by the 1st sourcing transistor T1 decreases, and when the amount of current sourced by the 1st additional transistor T2 decreases, the amount of current sourced by the 1st sourcing transistor T1 increases. Therefore, the gain of the signal amplification circuit increases when the amount of current sourced by the 1st additional transistor T2 increases, and decreases when the amount of current sourced by the 1st additional transistor T2 decreases.

Since the 1st and 2nd additional transistors T2 and T4 are turned on or off in response to the control signal CON, the amounts of current sourced by the 1st and 2nd sourcing transistors T1 and T2 and the 1st and 2nd additional transistors T2 and T4 are controlled in response to the control signal CON. Therefore, the gain of the signal amplification circuit is controlled in response to the control signal CON.

In the differential amplifier 110 of FIG. 2, when the control signal CON is activated to a low level, the amount of current sourced by the 1st sourcing transistor T1 decreases, and when the control signal CON is deactivated to a high level, the amount of current sourced by the 1st sourcing transistor T1 increases. Therefore, when the control signal CON is activated, the gain of the differential amplifier 110 increases, and when the control signal CON is deactivated, the gain of the differential amplifier 110 decreases.

The control signal CON is used to increase the amount of current sourced by the 1st additional transistor T2 at a rising edge or a falling edge of the output signal OUT, thereby decreasing the amount of current sourced by the 1st sourcing transistor T1. Then, the gain of the differential amplifier 110 is increased to improve the quality of the output signal OUT (the slew rate of the output signal OUT increases at the edge). The relationships between the activation and deactivation periods of the control signal CON and the input and output signals IN and OUT will be described below with reference to FIG. 4.

When the level of the input signal IN is higher than the reference voltage VREF, the output signal OUT becomes 'low', and when the level of the input signal IN is lower than the reference voltage VREF, the output signal OUT becomes 'high'. Since the operations of the 1st and 2nd sourcing transistors T1 and T3 and the 1st and 2nd sinking transistors T5 and T6 based on the level difference between the input signal IN and the reference voltage VREF are obvious to those skilled in the art to which the present invention pertains, the detailed descriptions thereof are omitted herein, and the operations of the 1st and 2nd additional transistors T2 and T4 based on the control signal CON will be described below.

When the control signal CON is activated, the 1st and 2nd additional transistors T2 and T4 are turned on. Therefore, a current flows across the 1st and 2nd additional transistor T2 and T4. Accordingly, since the amounts of current sourced by the 1st and 2nd current sinking units SO1 and SO2 increase, the gain of the differential amplifier 110 increases. When the control signal CON is deactivated, the 1st and 2nd additional transistors T2 and T4 are turned off. Therefore, a current does not flow across the 1st and 2nd additional transistors T2 and T4. Accordingly, since the amounts of current sourced by the 1st and 2nd current sourcing units SO1 and SO2 decrease, the gain of the differential amplifier 110 decreases.

In summary, the differential amplifier 110 of the signal amplification circuit in accordance with the embodiment of the present invention may additionally include the 1st and 2nd additional transistors T2 and T4 that are turned on or off in response to the control signal CON, thereby controlling the amounts of current sourced by the 1st and 2nd sourcing transistors T1 and T3 based on the control signal CON.

Referring to FIG. 2, a signal amplification circuit in accordance with another embodiment of the present invention will be described. The signal amplification circuit of FIG. 1 includes the controller 120 to generate the control signal CON by processing the output signal OUT. However, when the signal amplification circuit serves as an input buffer circuit of the semiconductor memory device, the output signal OUT is transferred to another component of the semiconductor memory device through various drivers (including an inverter) and logic gates. During this process, signals obtained by controlling the phase, inversion, and level of the output signal OUT are generated as output signals of the various drivers and logic gates. Therefore the signal amplification circuit does not necessarily include the controller 120 to generate the control signal CON by processing the output signal OUT, and the gain of the differential amplifier 110 may be adjusted using a signal outputted from a specific portion of the semiconductor memory device. The signal corresponds to the above-described control signal CON, and may include the output signal OUT of which the phase or level is changed or which is inverted while the output signal OUT passes through the various drivers and logic gates.

Therefore, the controller 120 illustrated in FIG. 2 may be an external circuit such as various drivers (including an inverter) and logic gates, and the control signal CON may be the output of the external circuit (which may be delayed, inverted, or level adjusted), and thus the signal amplification circuit according to embodiment of the present invention may include just the differential amplifier 110 shown in FIG. 2, which means that the controller 120 may not be included in the signal amplification circuit for the embodiment of the present invention. The detailed configuration and operation of the differential amplifier 110 are the same as described above with reference to FIG. 2.

Here, a proper signal among a plurality of signals, which are generated while the output signal OUT passes through various drivers and logic gates, may be used as the control signal CON. At this time, the control signal CON may be generated by delaying the output signal OUT or delaying and inverting the output signal OUT. Alternatively, the control signal CON may be generated by adjusting the level of the signal obtained by delaying the output signal OUT or delaying and inverting the output signal OUT.

The differential amplifier 110 illustrated in FIG. 2 forms a current mirror structure using the PMOS transistors T1 to T4, receives the input signal IN and the reference voltage VREF using the NMOS transistors T5 and T6, and performs biasing using the NMOS transistor N7. However, even when NMOS transistors are used to form a current mirror structure, PMOS transistors are used to receive the input signal IN and the reference voltage VREF, and a PMOS transistor is used to perform biasing, it is possible to configure a signal amplification circuit using the same principle as FIG. 2.

Figure 3:
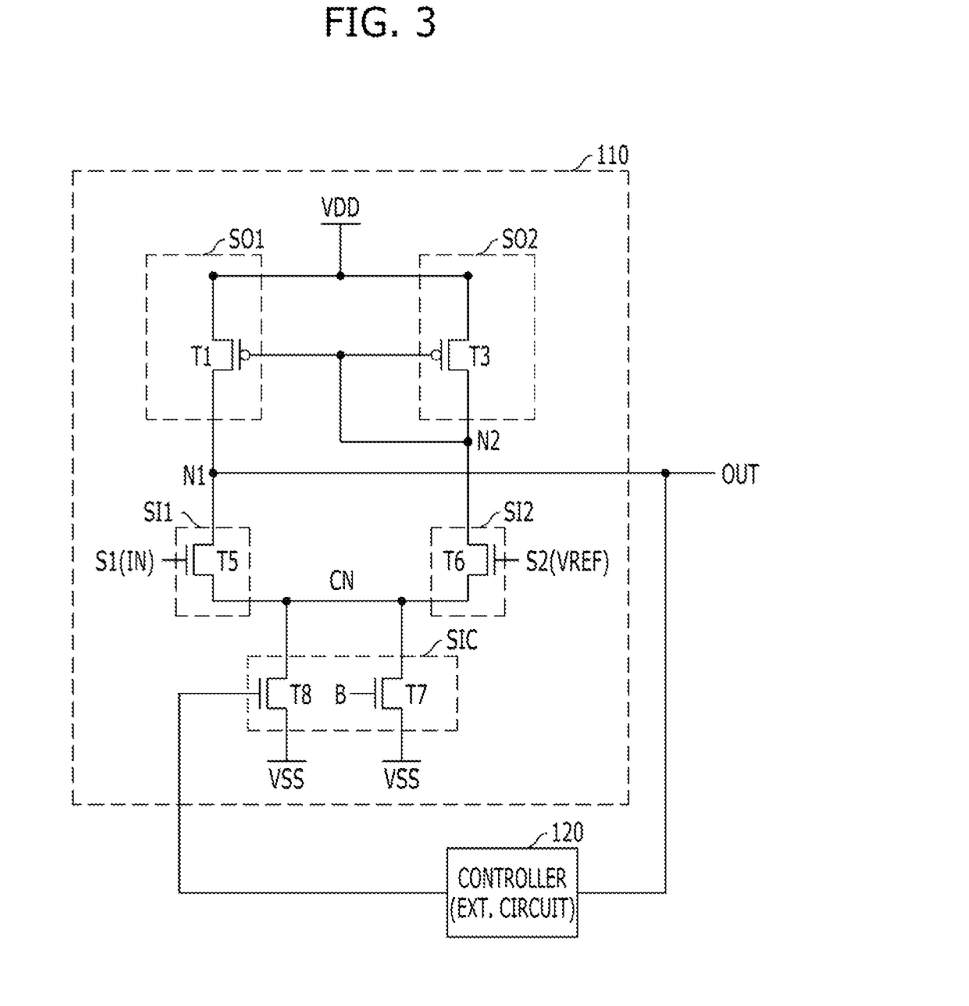
FIG. 3 is a configuration diagram illustrating a signal amplification circuit in accordance with another embodiment of the present invention.

FIG. 3 is a configuration diagram illustrating a signal amplification circuit in accordance with another embodiment of the present invention. FIG. 3 illustrates the detailed configuration of the differential amplifier 100 of FIG. 1 in accordance with the embodiment of the present invention.

Referring to FIG. 3, the differential amplifier 110 includes a 1st current sourcing unit SO1 to source a current to a 1st node N1, a 2nd current sourcing unit SO2 to source a current to a 2nd node N2, a 1st current sinking unit SI1 to sink a current from the 1st node N1 in response to a 1st signal S1, a 2nd current sinking unit SI2 to sink a current from the 2nd node N2 in response to a 2nd signal S2, and a common current sinking unit SIC to sink a current from a common node CN connected to the 1st and 2nd current sinking units SI1 and SI2.

An output signal OUT of the signal amplification circuit may be generated from the 1st node N1, the 1st and 2nd current sourcing units SO1 and SO2 may source a current in response to the voltage of the 2nd node N2, and an amount of current sunk by the common current sinking unit SIC may be controlled by a control signal CON.

The differential amplifier 110 of FIG. 3 controls the amount of current sunk by the common current sinking unit SIC based on the control signal CON, unlike the differential amplifier 110 of FIG. 2. Therefore, the 1st current sourcing unit SO1 does not include the 1st additional transistor T2 included the differential amplifier 110 of FIG. 2, and the 2nd current sourcing unit SO2 does not include the 2nd additional transistor T4. Instead, the common current sinking unit SIC of the differential amplifier 110 further includes a common sinking transistor T7 and a common additional sinking transistor T8. The common sinking transistor T7 is configured to sink a current from the common node CN based on a bias voltage B, and the common additional sinking transistor T8 is configured to sink a current from the common node CN in response to the control signal CON. The other configurations, connection states, and operations of the differential amplifier 110 are the same as the differential amplifier shown in FIG. 2.

Whether or not the differential amplifier 110 is enabled according to the application of the bias voltage B is decided in the same manner as described with reference to FIG. 2. In the following descriptions, a case in which the constant bias voltage B is supplied to enable the differential amplifier 110 will be taken as an example.

The controller 120 performs the same operation as described above with reference to FIG. 1. Therefore, the signal amplification circuit of FIG. 3 will be described based on the operation of the differential amplifier 110.

The signal amplification circuit of FIG. 3 controls an amount of current sunk from the common node CN by the common current sinking unit SIC and controls an amount of current sourced by the 1st sourcing transistor T1, thereby controlling the gain of the differential amplifier 110.

The entire gain of the above-described differential amplifier 110 is inversely proportional to the amount of current flowing in the 1st sourcing transistor T1. That is, when the amount of current flowing in the 1st sourcing transistor T1 increases, the gain of the differential amplifier 110 decreases, and when the amount of current flowing in the 1st sourcing transistor T1 decreases, the gain of the differential amplifier 110 increases.

Meanwhile, although the bias voltage B is constant, the common additional transistor T8 additionally sinks a current from the common node CN. Therefore, the amount of current sunk from the common node CN is adjusted in response to the control signal CON. Since the differential amplifier 110 has a current mirror structure, each of the amount of current sunk by the 1st current sinking unit. SI1 and the amount of current sunk by the 2nd current sinking unit SI2 corresponds to a half of the amount of current sunk by the common current sinking unit SIC, and is adjusted in response to the control signal CON. Here, when the amount of current flowing from the 1st node N1 to the outside of the signal amplification circuit is ignored, the amount of current sourced to the 1st node by the 1st sourcing transistor T1 must be equal to the amount of current sunk from the 1st node N1 by the 1st current sinking unit SI1 (Kirchhoff's laws). Therefore, the amount of current sourced by the 1st sourcing transistor T1 is controlled in response to the control signal CON.

Considering the relationship between the amount of current flowing in the 1st sourcing transistor T1 and the gain of the signal amplification circuit, the gain of the signal amplification circuit decreases when the amount of current sourced by the common additional transistor T8 increases, and increases when the amount of current sourced by the common additional transistor T8 decreases. That is, the gain of the signal amplification circuit is controlled in response to the control signal CON.

In the differential amplifier 110 of FIG. 3, when the control signal CON is activated to a low level, the amount of current sourced by the 1st sourcing transistor T1 decreases, and when the control signal CON is deactivated to a high level, the amount of current sourced by the 1st sourcing transistor T1 increases. Therefore, when the control signal CON is activated, the gain of the differential amplifier 110 increases, and when the control signal CON is deactivated, the gain of the differential amplifier 110 decreases.

The control signal CON may be used to decrease the amount of current sourced by the common transistor T8 at a rising edge or falling edge of the output signal OUT, thereby decreasing the amount of current sourced by the 1st sourcing transistor T1. Then, the gain of the differential amplifier 110 may be increased to improve the quality of the output signal OUTS. That is, the slew rate of the output signal OUT increases at the edge. The relationships between the activation and deactivation periods of the control signal CON and the input and output signals IN and OUT will be described below with reference to FIG. 4.

When the level of the input signal IN is higher than the reference voltage VREF, the output signal OUT becomes 'low', and when the level of the input signal IN is lower than the reference voltage VREF, the output signal OUT becomes 'high'. The operations of the 1st and 2nd sourcing transistors T1 and T3 and the 1st and 2nd sinking transistors T5 and T6 based on the level difference between the input signal IN and the reference voltage VREF are well-known to those skilled in the art to which the present invention pertains, and thus the detailed descriptions thereof are omitted herein.

The differential amplifier 110 of the signal amplification circuit in accordance with the embodiment of the present invention additionally includes the common additional transistor T8 that is turned on or off in response to the control signal CON, and controls the amounts of current sourced by the 1st and 2nd sourcing transistors T1 and T2 based on the control signal CON.

Referring to FIG. 3, a signal amplification circuit in accordance with the embodiment of the present invention will be described. The signal amplification circuit of FIG. 1 includes the controller 120 to generate the control signal CON by processing the output signal OUT. However, when the signal amplification circuit serves as an input buffer circuit of the semiconductor memory device, the output signal OUT is transferred to another component of the semiconductor memory device through various drivers (including an inverter) and logic gates. During this process, signals obtained by controlling the phase, inversion, and level of the output signal OUT are generated as output signals of the various drivers and logic gates. Therefore, the signal amplification circuit does not necessarily include the controller 120 to generate the control signal CON by processing the output signal OUT, and the gain of the differential amplifier 110 may be adjusted using a signal outputted from a specific portion of the semiconductor memory device. The signal corresponds to the above-described control signal CON, and may include the output signal OUT of which the phase or level is changed or which is inverted while the output signal OUT passes through the various drivers and logic gates.

Therefore, the signal amplification circuit does not include the controller 120 illustrated in FIG. 3, but includes the differential amplifier 110 having the same configuration as the differential amplifier 110 of FIG. 3. The detailed configuration and operation of the differential amplifier 110 are the same as described above with reference to FIG. 3.

Here, a proper signal among a plurality of signals, which are generated while the output signal OUT passes through the various drivers and logic gates, may be used as the control signal CON. At this time, the control signal CON may be generated by delaying the output signal OUT or delaying and inverting the output signal OUT. Alternatively, the control signal CON may be generated by adjusting the level of the signal obtained by delaying the output signal OUT or delaying and inverting the output signal OUT.

The differential amplifier 110 illustrated in FIG. 3 forms a current mirror structure using the PMOS transistors T1 and T3, receives the input signal IN and the reference voltage VREF using the NMOS transistors T5 and T6, and performs biasing using the NMOS transistor N7 and N8. However, even when NMOS transistors are used to form a current mirror structure, PMOS transistors are used to receive the input signal IN and the reference voltage VREF, and PMOS transistors are used to perform biasing, it is possible to the signal amplification circuit using the same principle as FIG. 3.

Figure 4:
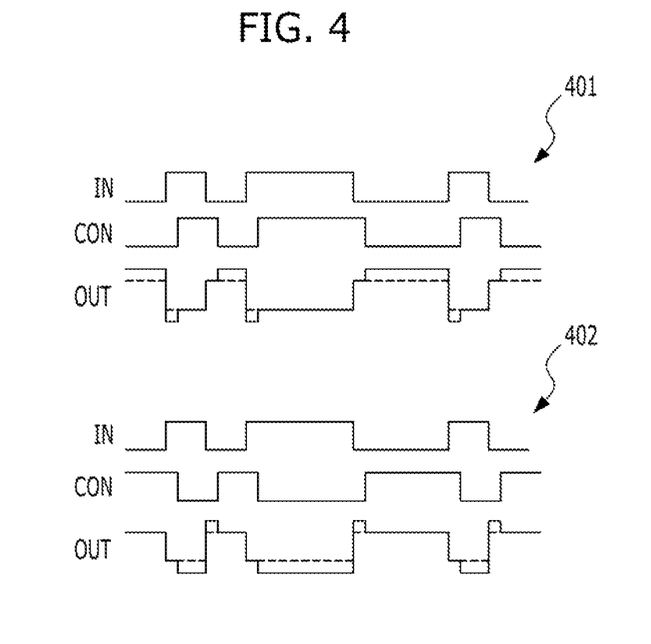
FIG. 4 is a waveform diagram for explaining the operation of the signal amplification circuit in accordance with the embodiment of the present invention.

FIG. 4 is a waveform diagram for explaining the operation of the signal amplification circuit in accordance with the embodiment of the present invention.

Referring to FIG. 4, a 1st waveform 401 illustrates the operation of the signal amplification circuit when the controller 120 generates the control signal CON by delaying the output signal OUT (or delaying the output signal OUT and adjusting the level of the output signal OUT). In FIG. 4, 'IN' represents an input signal, 'CON' represents a control signal, a dotted line of 'OUT' represents an output signal of a conventional signal amplification circuit, and a solid line of 'OUT' represents an output signal of the signal amplification circuit in accordance with the embodiment of the present invention.

As described with reference to FIGS. 2 and 3, the gain of the differential amplifier 110 of FIGS. 2 and 3 increases in a period where the control signal CON is activated to a low level. That is, the amount of current sourced by the 1st sourcing transistor T1 decreases. Furthermore, the gain of the differential amplifier 110 of FIGS. 2 and 3 decreases in a period where the control signal CON is deactivated to a high level. That is, the amount of current sourced by the 1st sourcing transistor T1 increases. Therefore, as illustrated in the 1st waveform 401, the amplification degree of the output signal OUT increases in the period where the control signal CON is activated to a low level, and decreases in the period where the control signal CON is deactivated to a high level.

When the output signal OUT (dotted line) of the conventional signal amplification circuit is compared to the output signal OUT (solid line) of the signal amplification circuit in accordance with the embodiment of the present invention, it may be seen that a falling edge of the output signal OUT (solid line) of the signal amplification circuit in accordance with the embodiment of the present invention is emphasized more than the output signal OUT (dotted line) of the conventional signal amplification circuit (the decreasing level increases at the falling edge, and a slew rate at the falling edge increases in the actual waveform diagram). That is, the quality of the output signal may be improved.

Referring to FIG. 4, a 2nd waveform 402 illustrates the operation of the signal amplification circuit when the controller 120 generates the control signal CON by delaying and inverting the output signal OUT (or delaying and inverting the output signal OUT and adjusting the level of the output signal OUT). In the 2nd waveform 420, 'IN' represents the input signal, 'CON' represents the control signal a dotted line of OUT represents the output signal of the conventional signal amplification circuit, and a solid line of 'OUT' represents the output signal of the signal amplification circuit in accordance with the embodiment of the present invention.

As described with reference to FIGS. 2 and 3, the gain of the differential amplifier 110 of FIGS. 2 and 3 increases in the period where the control signal CON is activated to a low level. That is, the amount of current sourced by the 1st sourcing transistor T1 decreases. Furthermore, the gain of the differential amplifier 110 of FIGS. 2 and 3 decreases in a period in which the control signal CON is deactivated to a high level. That is, the amount of current sourced by the 1st sourcing transistor T1 increases. Therefore, as illustrated in the 1st waveform 402, the amplification degree of the output signal OUT increases in the period in which the control signal CON is activated to a low level, and decreases in the period in which the control signal CON is deactivated to a high level.

When the output signal OUT (dotted line) of the conventional signal amplification circuit is compared to the output signal OUT (solid line) of the signal amplification circuit in accordance with the embodiment of the present invention, it may be seen that a rising edge of the output signal OUT (solid line) of the signal amplification circuit in accordance with the embodiment of the present invention is emphasized more than the output signal OUT (dotted line) of the conventional signal amplification circuit (the increasing level increases at the rising edge, and a slew rate at the rising edge increases in the actual waveform diagram). That is, the quality of the output signal OUT may be improved.

FIG. 4 illustrates a case in which the gain of the differential amplifier 110 of FIGS. 2 and 3 increases when the control signal CON becomes 'high' and decreases when the control signal CON becomes owl. This may differ depending on the design.

Figure 5:
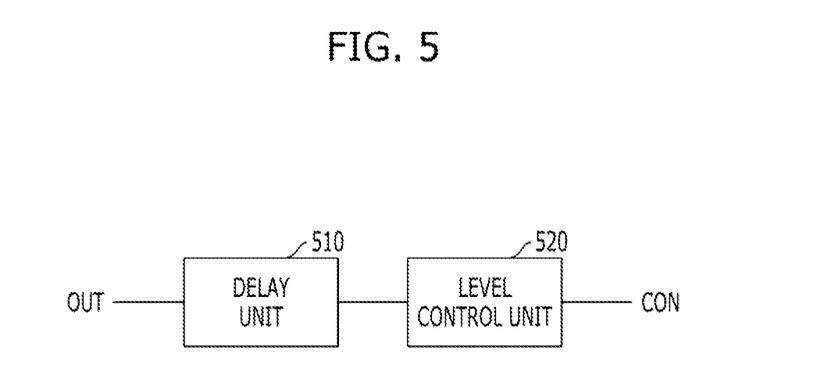
FIG. 5 is a block diagram illustrating a controller in accordance with the embodiment of the present invention.

FIG. 5 is a block diagram illustrating the controller 120 in accordance with the embodiment of the present invention.

Referring to FIG. 5, the controller 120 may include a delay unit 510 and a level control unit 520. The delay unit 510 is configured to delay the output signal OUT or delay and invert the output signal OUT. The level control unit 520 is configured to generate the control signal CON by adjusting the level of the output signal of the delay unit 510.

Here, the configuration of the control unit 120 is not limited to that illustrated in FIG. 5. The delay unit 510 is not necessarily positioned before the level control unit 520, and the sequence of the delay unit 510 and the level control unit 520 may be changed. Furthermore, the delay unit 510 and the level control unit 520 may be configured as one circuit. FIG. 5 illustrates an example of a configuration required for the controller 120 to perform a function of delaying (or delaying and inverting) an input signal and a function of adjusting the level of the input signal.

Figure 6:
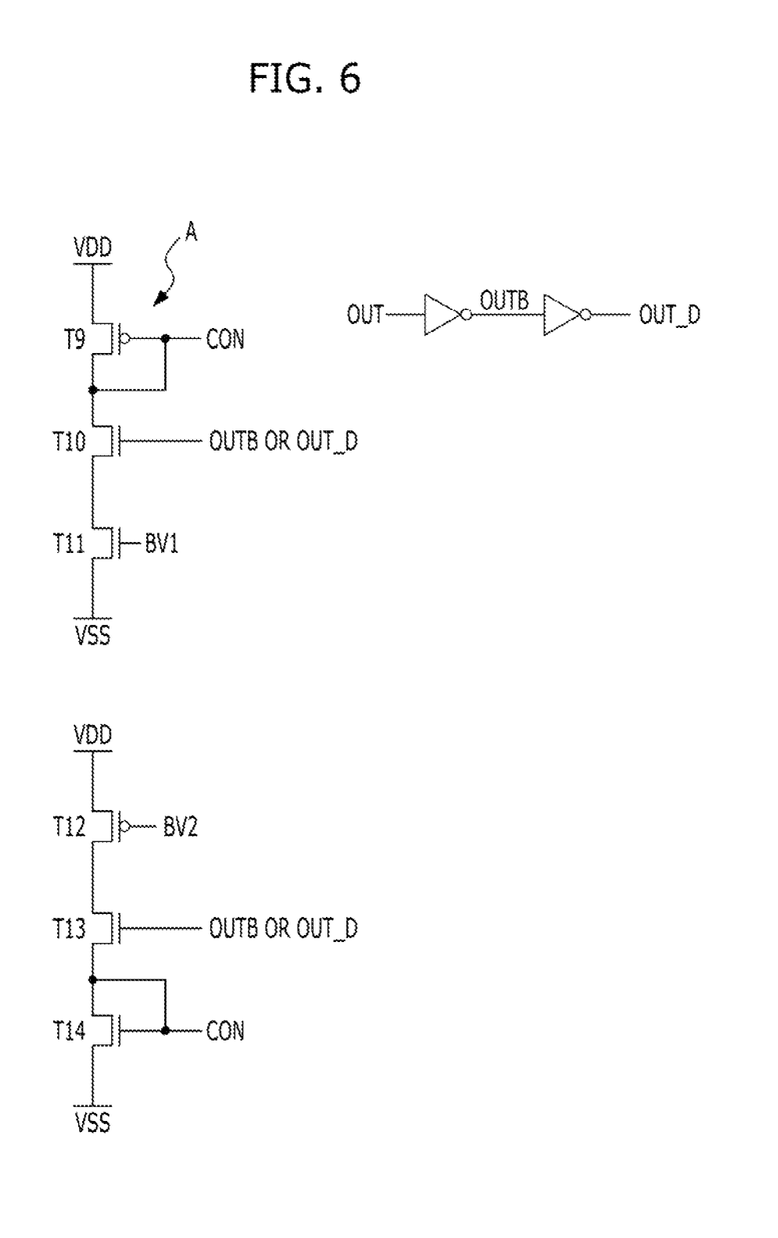
FIG. 6 is a diagram illustrating a specific example of the controller.

FIG. 6 is a diagram illustrating a specific example of the controller 120.

A 1st circuit A is an example of the controller 120.

The 1st circuit A is configured to delay the output signal OUT and generate a delayed signal OUT_D or delay and invert the output signal OUT and generate a delayed inverted signal OUTB, and generate the control signal CON using the delayed signal OUT_D or the delayed inverted signal OUTB. At this time, the delayed signal OUT_D does not need to be obtained by passing the output signal OUT through two inverters, and the delayed inverted signal OUTB does not need to be obtained by passing the output signal OUT through one inverter. The delayed signal OUT_D indicates a signal obtained by delaying the output signal OUT by a predetermined delay time, and the delayed inverted signal OUTB indicates a signal obtained by delaying the output signal OUT by a predetermined delay time and inverting the delayed signal.

In FIG. 6, 'T11' represents a bias transistor to pass a current in response to a bias voltage BV1. Based on the bias voltage BV1, the level of the outputted control signal CON is adjusted (suppose that the transistor T11 is turned on). When the delayed signal OUT_D or the delayed inverted signal OUTB becomes 'high', a transistor T10 is turned on to pull-down drive a control node where the control signal CON is generated (hereafter, represented by CON), and the control signal CON is activated to a low level. When the level of the control signal CON drops to a predetermined level or less, a transistor T9 is turned on to pull-up drive the control node CON, and the level of the control signal CON is maintained. Then, when the delay signal OUT_D or the delayed inverted signal OUTB becomes 'low', the transistor T10 is turned off. Therefore, the control node CON is pull-up driven to increase the level of the control signal CON. When the level of the control signal CON rises to a predetermined level or more, the transistor T9 is turned off. Therefore, the level of the control signal CON is maintained. That is, the transistors T9 to T11 invert the input signal, and control the level of the output signal based on the bias voltage VB1.

A 2nd circuit B is another example of the controller 120.

The 2nd circuit B is configured to delay the output signal OUT and generate a delayed signal OUT_D or delay and invert the output signal OUT and generate a delayed inverted signal OUTB, and generate the control signal CON using the delayed signal OUT_D or the delayed inverted signal OUTB. At this time, the delayed signal OUT_D does not need to be obtained by passing the output signal OUT through two inverters, and the delayed inverted signal OUTB does not need to be obtained by passing the output signal OUT through one inverter. The delayed signal OUT_D indicates a signal obtained by delaying the output signal OUT by a predetermined delay time, and the delayed inverted signal OUTB indicates a signal obtained by delaying the output signal OUT by a predetermined delay time and inverting the delayed signal.

In FIG. 6, 'T12' represents a bias transistor to pass a current in response to, a bias voltage BV2. Based on the bias voltage BV2, the level of the outputted control signal CON is adjusted (suppose that the transistor T12 is turned on). When the delayed signal OUT_D or the delayed inverted signal OUTB becomes 'high', a transistor T13 is turned on to pull-up drive a control node where the control signal CON is generated (hereafter, represented by CON), and the control signal CON is deactivated to a high level. When the level of the control signal CON rises to a predetermined level or more, the transistor T14 is turned on to pull-down drive the control node CON, and the level of the control signal CON is maintained. Then, when the delay signal OUT_D or the delayed inverted signal OUTB becomes 'low', the transistor T13 is turned off. Therefore, the control node CON is pull-up driven to decrease the level of the control signal CON. When the level of the control signal CON drops to a predetermined level or less, the transistor T14 is turned off. Therefore, the level of the control signal CON is maintained. That is, the transistors T12 to T14 invert an input signal, and control the level of an output signal based on the bias voltage VB2.

According to the present invention, the signal amplification circuit may control the amount of current flowing therein using the output signal thereof. This may improve the quality of the output signal through a relatively simple configuration.

While the present invention has been described with respect to the specific embodiments, it will be apparent to those skilled in the art that various changes and modifications may be made without departing from the spirit and scope of the invention as defined in the following claims.

What is claimed is:

1. A signal amplification circuit comprising:
    a differential amplifier configured to receive a first (1st) signal and a second (2nd) signal and generate an output signal; and
    a controller configured to generate a control signal for controlling an amount of current flowing in the differential amplifier using the output signal,
    wherein the differential amplifier comprises:
    a first current sourcing unit configured to source a current to a first node that is an output node of the signal amplification circuit;
    a second current sourcing unit configured to source a current to a second node;
    a first current sinking unit configured to sink a current from the first node in response to the first signal;
    a second current sinking unit configured to sink a current from the second node in response to the second signal, wherein the first and second current sourcing units source a current in response to the control signal and a voltage of the second node; and
    a common current sinking unit configured to sink a current from a common node connected to the first and second current sinking units,
    wherein the first current sourcing unit comprises:
    a first sourcing transistor connected to the first node and configured to pass a current through both ends thereof in response to the voltage of the second node; and a first additional transistor connected to the first node and configured to pass a current through both ends thereof in response to the control signal, and wherein the second current sourcing unit comprises:
a second sourcing transistor connected to the second node and configured to pass a current through both ends thereof in response to the voltage of the second node; and
a second additional transistor connected to the second node and configured to pass a current through both ends thereof in response to the control signal.

2. The signal amplification circuit of claim 1, wherein the controller generates the control signal by performing at least one of delaying, inverting, and level adjusting of the output signal.

3. The signal amplification circuit of claim 1, wherein amounts of current sourced by the first sourcing transistor, the first additional transistor, the second sourcing transistor, and the second additional transistor are controlled by the control signal.

4. The signal amplification circuit of claim 1, wherein one of the first and second signals is an input signal and the other is a reference voltage.

5. A signal amplification circuit comprising:
a differential amplifier configured to receive a first (1st) signal and a second (2nd) signal and generate an output signal; and
a controller configured to generate a control signal for controlling an amount of current flowing in the differential amplifier using the output signal,
wherein the differential amplifier comprises:
a first current sourcing unit configured to source a current to a first node that is an output node of the signal amplification circuit;
a second current sourcing unit configured to source a current to a second node;
a first current sinking unit configured to sink a current from the first node in response to the first signal;
a second current sinking unit configured to sink a current from the second node in response to the second signal; and
a common current sinking unit configured to sink a current from a common node connected to the first and second current sinking units, wherein an amount of current sunk by the common current sinking unit is controlled by the control signal,
wherein the common current sinking unit comprises:
a sinking transistor configured to sink a current from the common node in response to a bias voltage; and
an additional sinking transistor configured to sink a current from the common node in response to the control signal.

6. The signal amplification circuit of claim 5, wherein the controller generates the control signal by delaying, inverting, and/or level adjusting the output signal.

7. The signal amplification circuit of claim 5, wherein one of the first and second signals is an input signal and the other is a reference voltage.

8. A signal amplification circuit comprising:
a current sourcing unit configured to source a current to first and second nodes; and
a current sinking unit configured to sink a current from the first node in response to a first signal and sink a current from the second node in response to a second signal,
wherein the current sourcing unit comprises:
a first sourcing transistor connected to the first node and configured to pass a current through both ends thereof in response to the voltage of the second node;
a first additional transistor connected to the first node and configured to pass a current through both ends thereof in response to a control signal generated by using an output signal of the first node;
a second sourcing transistor connected to the second node and configured to pass a current through both ends thereof in response to the voltage of the second node; and
a second additional transistor connected to the second node and configured to pass a current through both ends thereof in response to the control signal.

9. A signal amplification circuit comprising:
a current sourcing unit configured to source a current to first and second nodes;
a first current sinking unit configured to sink a current from the first node in response to a first signal;
a second current sinking unit configured to sink a current from the second node in response to a second signal; and
a common current sinking unit configured to sink a current from a common node connected to the first and second current sinking units,
where the common current sinking unit comprises:
a sinking transistor configured to sink a current from the common node in response to a bias voltage; and
an additional sinking transistor configured to sink a current from the common node in response to a control signal generated by using an output signal of the first node.

* * * * *